United States Patent [19]
Bruel

[11] Patent Number: 6,059,877
[45] Date of Patent: May 9, 2000

[54] METHOD FOR OBTAINING A WAFER IN SEMICONDUCTING MATERIAL OF LARGE DIMENSIONS AND USE OF THE RESULTING WAFER FOR PRODUCING SUBSTRATES OF THE SEMICONDUCTOR ON INSULATOR TYPE

[75] Inventor: Michel Bruel, Veurey, France

[73] Assignee: Commisariat a l'Energie Atomique, Paris, France

[21] Appl. No.: 09/147,692
[22] PCT Filed: Aug. 26, 1997
[86] PCT No.: PCT/FR97/01526
§ 371 Date: Feb. 17, 1999
§ 102(e) Date: Feb. 17, 1999
[87] PCT Pub. No.: WO98/08664
PCT Pub. Date: Mar. 5, 1998

[30] Foreign Application Priority Data

Aug. 27, 1996 [FR] France ................................. 96 10482

[51] Int. Cl.[7] ................................................ C30B 15/00
[52] U.S. Cl. .................................................. 117/35; 26/902
[58] Field of Search .............................. 117/26, 35, 902, 117/913

[56] References Cited

U.S. PATENT DOCUMENTS

| | | | |
|---|---|---|---|
| 2,442,755 | 6/1948 | Christensen | 117/2 |
| 2,543,071 | 2/1951 | Shawson | 117/11 |
| 4,442,178 | 4/1984 | Kimura et al. | 428/446 |
| 5,769,941 | 6/1998 | Chiou | 117/2 |
| 5,792,566 | 8/1998 | Young et al. | 428/688 |

*Primary Examiner*—Felisa Hiteshew
*Attorney, Agent, or Firm*—Oblon, Spivak, McClelland, Maier & Neustadt, P.C.

[57] ABSTRACT

A process for obtaining at least one wafer of semiconducting material, including the step of cutting an ingot of semiconducting material along a longitudinal plane of the ingot to obtain a wafer with large dimensions. The wafer obtained may be used to make a Semiconductor on Insulator type substrate, for example a Silicon On Insulator substrate.

26 Claims, 1 Drawing Sheet

METHOD FOR OBTAINING A WAFER IN SEMICONDUCTING MATERIAL OF LARGE DIMENSIONS AND USE OF THE RESULTING WAFER FOR PRODUCING SUBSTRATES OF THE SEMICONDUCTOR ON INSULATOR TYPE

This application is a 371 of PCT/FR97/01526 filed Aug. 26, 1997.

BACKGROUND OF THE INVENTION

1. Field of the Invention

This invention relates to a process for making a wafer with large dimensions made of a semiconducting material. It also concerns the use of the resulting wafer to make Semiconductor On Insulator type substrates, and particularly Silicon On Insulator substrates.

2. Discussion of the Background

There are several known processes for making a substrate composed of a layer or a film of semiconducting material on an insulating support. In particular, these processes can be used to make Silicon On Insulator type substrates.

Hetero-epitaxy methods can be used for crystalline growth, for example to grow a silicon crystal as a thin film on a mono-crystalline substrate of another nature, which has a mesh parameter similar to the mesh parameter of silicon, for example a sapphire substrate ($Al_2O_3$) or a calcium fluoride ($CaF_2$) substrate.

The SIMOX process uses ionic implantation with a high oxygen dose without a silicon substrate to create a layer of silicon oxide within the volume of the silicon, separating a thin film of mono-crystalline silicon from the mass of the substrate.

Other processes use the principle of thinning a wafer by mechanical-chemical or chemical abrasion. The most efficient processes in this category also use the principle of an etching stop barrier that stops thinning of the wafer as soon as the required thickness is reached, and therefore guarantee a uniform thickness. As an example, this technique consists of p type doping of an n type substrate over the required film thickness, and chemically etching the substrate with a chemical bath that is active for n type silicon and inactive for p type silicon.

The main applications of thin semiconductor films are Silicon On Insulator substrates, silicon or silicon carbide self-supporting membranes to make masks for X-ray lithography, sensors, solar cells, and production of integrated circuits with several active layers.

The various methods of making thin films have disadvantages related to manufacturing techniques.

Hetero-epitaxy methods are limited by the nature of the substrate. Since the substrate mesh parameter is not exactly the same as for the semiconductor, the thin film will contain many crystalline defects. Furthermore, these substrates are expensive and fragile, and are only available in limited dimensions.

The SIMOX method requires ionic implantation with a very high dose which requires a very heavy and complex implantation machine. The throughput of these machines is low and it is difficult to see how it could be increased in significant proportions.

Methods of reducing the thickness are competitive from the point of view of homogeneity and quality only if they use the etching stop barrier principle. Unfortunately, creating the stop barrier makes this process complex and in some cases can limit applications of the film. If the etching stop is made by p type doping in an n type substrate, any electronic devices made using this film must be designed as a function of the p type nature of the film.

A more recent process was developed to overcome the disadvantages of these prior techniques. This process, described in document FR-A-2 681 472, consists of submitting a wafer of the required semiconducting material and with a plane surface to the following steps:

a first step of implantation by bombarding the plane surface of the wafer by means of ions, creating a layer of micro-cavities within the thickness of the wafer and at a depth approximately equal to the ion penetration depth, this layer separating the wafer into a lower region making up the mass of the substrate and an upper region forming the thin film, the ions being chosen to be rare gas or hydrogen gas ons, and the temperature of the wafer being kept below the temperature at which implanted ions can escape from the semiconductor by diffusion;

possibly a second step in which the plane surface of the wafer is put into intimate contact with a support (stiffener) composed of at least one layer of rigid material, this intimate contact possibly being made for example using an adhesive substance or by the effect of a preliminary surface preparation and possibly a heat and/or electrostatic treatment to encourage inter-atomic bond between the support and the wafer;

a third step in which the wafer and the support assembly are heat treated at a temperature exceeding the temperature at which the implantation was carried out and sufficient to create a separation between the thin film and the mass of the substrate by a crystalline rearrangement effect in the wafer and pressure on micro-cavities (for example his temperature could be 500° C. for silicon).

This process is very promising. For example, it can be used to obtain SOI (Silicon On Insulator) substrates starting from monocrystalline silicon wafers. For microelectronics applications, the semiconducting material must be of electronics quality. In the case of silicon, wafers of this quality are obtained industrially using two growth methods: the Czochralski pulling method starting from a molten silicon bath (CZ), and the zone fusion method starting from a polycrystalline ingot (FZ), the first method being used more frequently. These growth methods provide cylindrical ingots which are cut into slices perpendicular to the axis of the cylinder, usually using a circular saw cutting internally.

An electronics expert who would like to use the process described in document FR-A-2 681 472 would therefore use a wafer cut from a slice of a semiconductor ingot as the source of the semiconducting material. If he wants to obtain a large SOI substrate, he will cut the wafer appropriately in the slice. Current technology is capable of making 300 mm diameter ingots, and therefore this dimension imposes dimensional limits on the SOI substrate.

However, cases arise in which dimensions of SOI substrates larger than the largest ingots are required. For example, this is the case for "silicon on glass" applications, particularly to make LCD/TFT type display screens. These screens are rectangular, for example in the 16/9 format. Therefore a 300 mm high screen with this format will be about 533 mm wide, and consequently a 300 mm diameter wafer cannot be used to make this type of screen.

Other applications also require substrates with comparable dimensions; thin silicon self-supporting films, light cells.

Therefore, this type of large device cannot be made from a conventional circular wafer composed of a slice of a semiconducting ingot.

SUMMARY OF THE INVENTION

In order to overcome this disadvantage, this invention proposes to cut the cylindrical ingot into longitudinal slices parallel to the axis of the cylinder, rather than into slices perpendicular to the axis of the cylinder, the ingot being chosen such that its diameter is at least equal to the width of the required wafer and its length is at least equal to the length of the required wafer.

This method of cutting the ingot of semiconducting material goes against all standard practice adopted both by the user of semiconducting wafers and by the manufacturer. The user purchases his wafer, from the manufacturer as a function of the available sizes. The manufacturer does not think of cutting ingots of semiconducting material in any way other than the conventional way, particularly because his equipment is designed for this.

Therefore, the purpose of the invention is a process for obtaining at least one silicon wafer by cutting in a silicon ingot, characterized in that the cut is made along a longitudinal plane of the ingot. This cut can make a wafer with large dimensions.

A longitudinal plane of an ingot means a plane that is not necessarily parallel to the axis along the longest dimension of the ingot. The plane may be inclined with respect to the axis of the largest dimension of the ingots, for example to respect a particular crystallographic plane of a mono-crystalline semiconducting material, the principle of the invention being that it can obtain wafers with a surface area greater than the surface area of a wafer obtained by cutting perpendicular to the axis of the largest dimension of the ingot.

The cut may advantageously be made along a plane which is parallel, or approximately parallel, to a crystallographic plane existing in the silicon ingot. Another innovative aspect of the invention is that the cut may not only be made longitudinally along an ingot, but it may also be used to obtain crystallographically-oriented substrates.

However, in general, the invention is applicable to ingots of any semiconducting material (mono-crystalline, polycrystalline, amorphous).

The process according to the invention particularly concerns the case in which the ingot is a silicon ingot obtained by CZ or FZ pulling. In this case, he ingot may have been obtained by pulling that gives a plane of the <1,0,0> type perpendicular to the axis of the ingot.

The ingot may advantageously be cut in two different manners. It may be cut into parallel wafers. It may also be cut into two groups of wafers, the wafers in one group being parallel to each other and perpendicular to the wafers in the other group.

A wafer made in this manner can advantageously be used to make a semiconductor on insulator type substrate, and particular a substrate with large dimensions. It is then particularly interesting to obtain this substrate using the process described in document FR-A-2 681 472, and using a support containing at least one insulating part.

BRIEF DESCRIPTION OF THE DRAWINGS

The invention will be better understood, and other advantages and specific features will become obvious by reading the following description given as a nonrestrictive example, accompanied by the attached drawings in which.

DETAILED DESCRIPTION OF THE PREFERRED EMBODIMENTS

Throughout the rest of the description, the ingot of semiconducting material described is an ingot of mono-crystalline silicon and the required wafer is a rectangular-shaped wafer. This material was chosen because it is by far the most frequently used material in micro-electronics. However, the invention is not limited to this type of material.

Figure 1:
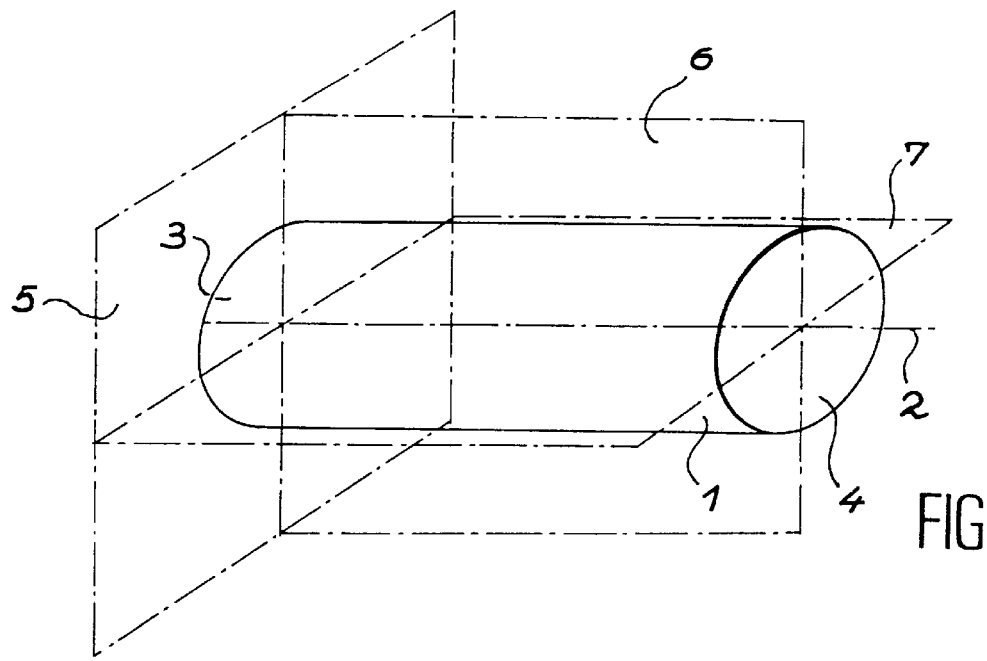
FIG. 1 shows an ingot of mono-crystalline silicon, with which crystallographic planes are associated.

FIG. 1 shows an ingot 1 of mono-crystalline silicon obtained by CZ or FZ pulling. It is approximately in the shape of a cylinder of evolution with axis 2. Two bases 3 and 4 can be defined perpendicular to axis 2 for this cylindrical ingot. Pulling was chosen to obtain an ingot oriented along the <1,0,0> crystallographic plane, which is marked as reference 5 in FIG. 1. In this case, there are two other type <1,0,0> planes, the <0,0,1> and <0,1,0> planes references 6 and 7 parallel to the ingot axis 2.

Since the purpose of the invention is to obtain at least one wafer with large dimensions, the ingot diameter is at least equal to the width of the rectangular surface of the wafer and it is pulled such that the length of the ingot is at least equal to the length of the rectangular surface of the wafer to be obtained.

Figure 2:
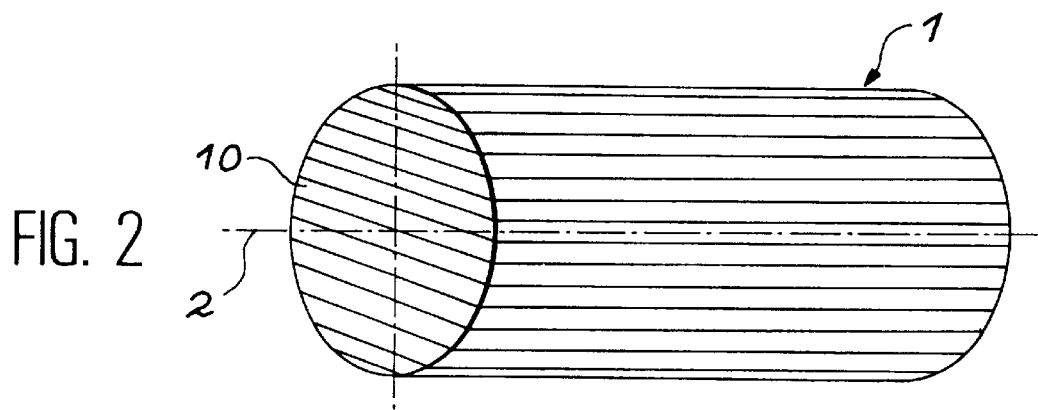
FIG. 2 illustrates a first way of cutting an ingot of semiconducting material according to the invention.

FIG. 2 shows a first manner of cutting the ingot 1 as illustrated in FIG. 1. In this case, the cut is made so that wafers are parallel with each other and are parallel to one of the <1,0,0> plane references 6 and 7 in FIG. 1. The wafers obtained, like wafer 10, are all of the same length but have different widths. Preferably, the cut will be made using a wire saw.

Figure 3:
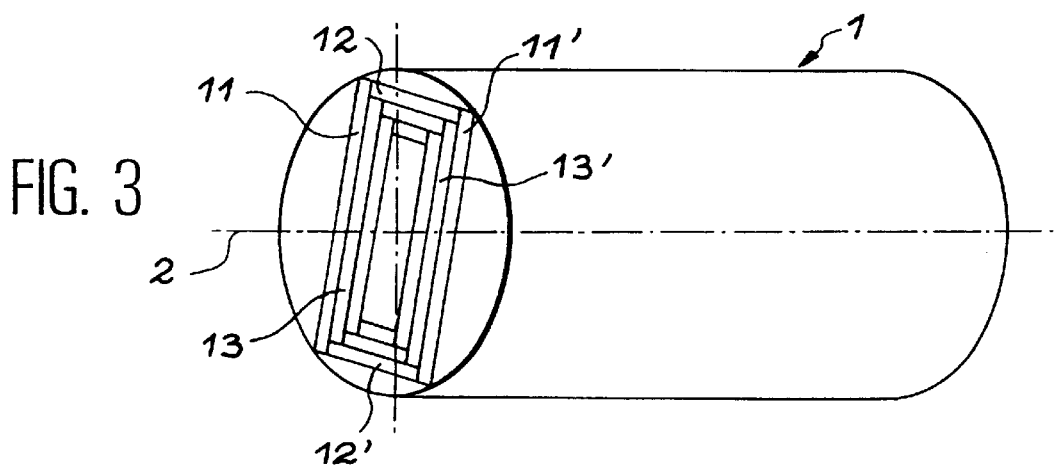
FIG. 3 illustrates a second way of cutting an ingot of semiconducting material according to the invention.

FIG. 3 shows a second way of cutting ingot 1 as illustrated in FIG. 1. The cut may be obtained by periodically turning the ingot through 90° about its main axis 2. Thus, for example after cutting the two wafers 11 and 11', the ingot may be turned by 90° and two wafers 12 and 12' may be cut, and it then may be rotated by 90° to cut two wafers 13 and 13', etc. The cut is also preferably made using a wire saw.

The wafers obtained may then be subject to heat treatments used in micro-electronics and particularly a conventional polishing treatment in order to produce a micro-electronics surface quality.

The process for obtaining a Silicon On Insulator substrate described in document FR-A-2 681 472 may then be used, by taking a wafer thus obtained as the silicon source.

Each mono-crystalline silicon wafer thus manufactured can be used to make a number of SOI substrates (for example Silicon-On-Glass). The thickness of the wafers obtained is of the order of one mm or several mm and the thickness of the silicon transferred onto the insulating support is of the order of a micrometer. After the silicon transfer process according to FR-A-2 681 472 (possibly without stiffener) has been applied, the wafer simply has to be repolished and it can then be reused. After applying the silicon transfer process, it would also be possible to repolish the wafer surface and perform another silicon on silicon epitaxy on it in order to reconstitute the initial thickness.

This epitaxy technique may also be used to reconstitute the semiconductor ingot to restore part or all of its initial thickness after cutting a wafer.

What is claimed is:

1. A process of manufacturing at least one silicon wafer, comprising:

cutting a silicon ingot along a longitudinal plane of the silicon ingot, wherein said longitudinal plane is parallel or approximately parallel to a crystallographic plane within the silicon ingot.

2. A process according to claim 1, wherein cutting is performed along a plane parallel to the axis parallel to th largest dimension of the silicon ingot.

3. A process according to claim 1, comprising CZ or FZ pulling said silicon ingot.

4. A process according to claim 3, wherein pulling is performed to produce a <1,0,0> plane perpendicular to the axis of the silicon ingot.

5. A process according to claim 1, further comprising performing an epitaxy after cutting the silicon ingot to reconstitute all or part of the thickness of the cut wafer.

6. A process according to claim 1, wherein cutting is performed by cutting the silicon ingot into wafers parallel to each other.

7. A process according to claim 1, wherein cutting is performed by cutting the silicon ingot into two groups of wafers, the wafers in one group being parallel to each other and perpendicular to the wafers in the other group.

8. A process according to claim 7, wherein two wafers in one group are cut, and then two wafers in the other group are cut.

9. A process of manufacturing wafers of a semiconducting material, comprising:

cutting an ingot of semiconducting material along a longitudinal plane of the ingot, wherein said ingot is cut into two groups of wafers, the wafers in one group being parallel to each other and perpendicular to the wafers in the other group.

10. A process according to claim 9, wherein two wafers in one group are cut, and then two wafers in the other group are cut.

11. A process for manufacturing at least one wafer of a semiconducting material, comprising:

cutting an ingot of semiconducting material along a longitudinal plane of the ingot, said longitudinal plane being parallel or approximately parallel to a crystallographic plane within the ingot of semiconducting material; and performing an epitaxy after cutting the ingot in order to reconstitute all or part of the thickness of the cut wafer.

12. A process according to claim 11, wherein cutting is performed parallel to the axis parallel to the largest dimension of the ingot.

13. A process according to claim 11, comprising CZ or FZ pulling said ingot of semiconducting material.

14. A process according to claim 13, wherein pulling is performed so as to produce a <1,0,0> plane perpendicular to the axis of the ingot.

15. A process according to claim 11, wherein cutting is performed by cutting the ingot into wafers parallel to each other.

16. A process according to claim 11, wherein cutting is performed by cutting the ingot into two groups of wafers, the wafers in one group being parallel to each other and perpendicular to the wafers in the other group.

17. A process according to claim 16, wherein two wafers in one group are cut, and then two wafers in the other group are cut.

18. In a process of manufacturing a semiconductor on insulator substrate, the improvement comprising):

manufacturing a wafer, comprising, cutting an ingot of semiconducting material along a longitudinal plane of the ingot, said longitudinal plane being parallel or approximately parallel to a crystallographic plane within the ingot of semiconducting material, and performing an epitaxy after cutting the ingot in order to reconstitute all or part of the thickness of the cut wafer.

19. A process according to claim 18, further comprising:

submitting the wafer to an ionic implantation to obtain a micro-cavities layer delimiting a thin film in the wafer;

placing the thin film side of the wafer into intimate contact with a support comprising at least one insulating part; and subjecting the wafer and support assembly to a heat treatment to separate the thin film from the rest of the wafer.

20. A process according to claim 19, further comprising subjecting the rest of the wafer to epitaxy to reconstitute all or part of the thin film thickness.

21. In a process of manufacturing a semiconductor on insulator substrate, the improvement comprising:

manufacturing a silicon wafer, comprising, cutting a silicon ingot along a longitudinal plane of the silicon ingot, wherein said longitudinal plane is parallel or approximately parallel to a crystallographic plane within the silicon ingot.

22. A process according to claim 21, further comprising:

submitting the silicon wafer to an ionic implantation to obtain a micro-cavities layer delimiting a thin film in the silicon wafer;

placing the thin film side of the silicon wafer into intimate contact with a support comprising at least one insulating part; and subjecting the silicon wafer and support assembly to a heat treatment to separate the thin film from the rest of the wafer.

23. A process according to claim 22, further comprising subjecting the rest of the silicon wafer to epitaxy to reconstitute all or part of the thin film thickness.

24. In a process of manufacturing a semiconductor on insulator substrate, the improvement comprising:

manufacturing a wafer, comprising, cutting an ingot of semiconducting material along a longitudinal plane of the ingot, wherein said ingot is cut into two groups of wafers, the wafers in one group being parallel to each other and perpendicular to the wafers in the other group.

25. A process according to claim 24, further comprising:

submitting the wafer to an ionic implantation to obtain a micro-cavities layer delimiting a thin film in the wafer;

placing the thin film side of the wafer into intimate contact with a support comprising at least one insulating part; and subjecting the wafer and support assembly to a heat treatment to separate the thin film from the rest of the wafer.

26. A process according to claim 25, further comprising subjecting the rest of the wafer to epitaxy to reconstitute all or part of the thin film thickness.

* * * * *